United States Patent
Yoda et al.

(10) Patent No.: US 6,307,708 B1
(45) Date of Patent: Oct. 23, 2001

(54) EXCHANGE COUPLING FILM HAVING A PLURALITY OF LOCAL MAGNETIC REGIONS, MAGNETIC SENSOR HAVING THE EXCHANGE COUPLING FILM, AND MAGNETIC HEAD HAVING THE SAME

(75) Inventors: Hiroaki Yoda; Masatoshi Yoshikawa; Yuichi Ohsawa; Tomomi Funayama, all of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/268,322

(22) Filed: Mar. 16, 1999

(30) Foreign Application Priority Data

Mar. 17, 1998 (JP) .................................. 10-067077

(51) Int. Cl.⁷ ............................... G11B 5/147; G11B 5/39
(52) U.S. Cl. ............................................ 360/126; 360/321
(58) Field of Search ............................... 360/313, 324.1, 360/324.11, 327.32, 126, 321

(56) References Cited

U.S. PATENT DOCUMENTS

| | | | |
|---|---|---|---|
| 5,155,642 | * 10/1992 | Voegeli ................................ | 360/113 |
| 5,764,445 | * 6/1998 | Torng et al. ......................... | 360/113 |
| 5,876,848 | * 3/1999 | Tan et al. ............................. | 428/336 |
| 5,936,400 | * 8/1999 | Tchertkov et al. ............... | 324/207.21 |
| 5,974,657 | * 11/1999 | Fox et al. ........................... | 29/603.08 |
| 5,995,339 | * 11/1999 | Koshikawa et al. ................. | 360/113 |
| 6,052,262 | * 4/2000 | Kamiguchi et al. ................. | 360/113 |
| 6,064,552 | * 5/2000 | Iwasaki et al. ...................... | 360/113 |
| 6,088,195 | * 7/2000 | Kamiguchi et al. ................. | 360/113 |

FOREIGN PATENT DOCUMENTS

WO 97/16823 * 5/1997 (WO).

* cited by examiner

*Primary Examiner*—Jefferson Evans
(74) *Attorney, Agent, or Firm*—Oblon, Spivak, McClelland, Maier & Neustadt, P.C.

(57) ABSTRACT

An exchange coupling film, magnetic sensor having the exchange coupling film, and a magnetic head having the same. The exchange coupling film includes a ferromagnetic layer and an antiferromagnetic layer where a total a magnetic anisotropy is controlled to be dispersed by annealing or depositing the film in rotating magnetic fields. Small local magnetic regions of different uniaxial anisotropy are introduced in the exchange coupling film. The magnetic anisotropy dispersion of the exchange coupling film results in prohibiting large domain wall transfer of an irreversible change in magnetization direction and suppressing BHN.

20 Claims, 8 Drawing Sheets

ABS

ABS

ABS

EXCHANGE COUPLING FILM HAVING A PLURALITY OF LOCAL MAGNETIC REGIONS, MAGNETIC SENSOR HAVING THE EXCHANGE COUPLING FILM, AND MAGNETIC HEAD HAVING THE SAME

BACKGROUND OF THE INVENTION

1. Field of the Invention

The present invention relates to an exchange coupling film and a magnetic sensor having an exchange coupling film, and more particularly, to an exchange coupling film having magnetic anisotropy dispersion and a magnetic sensor having an exchange coupling film with magnetic anisotropy dispersion.

2. Discussion of the Background

Magnetic recording devices such as a Hard Disk Drive (HDD) are required to have a compact external form and high recording density. To achieve these requirements, the recording track width should be narrower for high widthwise density and high recording track lengthwise density.

A MagnetoResistance effect head (MR head) of high sensitivity in reproducing a magnetic signal from a magnetic recording medium of such high track widthwise density has been reported. The conventional MR head had an AnisotropicMagnetoResistance effect element (AMR element) and a Giant MagnetoResistance head (GMR head). That the GMR head can obtain higher sensitivity than the AMR head has also been reported.

The AMR or GMR head each coupled with a planar yoke body was introduced in pending U.S. patent application Ser. No. 08/815,179 which corresponds to Japanese Patent Publication (Kokai) 10-143821.

Referring to FIG. 1, MR film 27 is disposed on magnetic yokes (cores) 24 and also coupled to a pair of electrodes 30. The magnetic yokes 24 are separated by a magnetic gap 25 at an Air Bearing Surface (ABS) which faces the magnetic recording medium. The magnetic yokes are disposed on magnetic shield film 22 formed on a substrate 21. The MR film 27 is separated from the ABS and magnetic gap 25 at ABS is so thin that the required high track widthwise and lengthwise density is obtained by the head structure. A magnetic signal from the medium is picked up by the pole tip portions of the yokes separated by the gap 25 at the ABS and introduced to the MR film 27. A resistance variation of the MR film 27 is sensed by a voltage detector coupled to the pair of electrodes 30(not shown).

Magnetic domain walls 36 each surrounding a large magnetic domain of magnification direction transfer in the conventional magnetic yoke 24 as shown in FIG. 2 and the movement of the domain walls 36 produces an irreversible change in magnetization direction that the signal transmission in the core 24 may be discontinuous enough to raise the BaukHausen Noise (BHN). Such magnetic domain wall movement causing magnetic transfer in the conventional magnetic yoke 24 has a large influence because area of the yoke is up to 200 micrometer×200 micrometer and discontinuous signal transmission becomes a larger problem to magnetic variation than the one in a magnetic body having an area of 1 centimeter×1 centimeter.

FIG. 3 is data showing relation between external magnetic field (H) and magnetization (M) of the conventional magnetic core 24 recently obtained by the present invention (Delta Mb)/delta M) in every directions of the conventional magnetic core, which is around 30%, as shown in FIG. 3. Where delta Mb is most drastic magnetization change which appears as BHN and equal to difference between the MB1 and Mb2. Delta M is the magnetization range of the exchange coupling film ranging from negative saturation magnetization (minus M) to positive saturation magnetization (plus M), when external magnetic fields (H) are applied to the exchange coupling film. The M-H curve may be measured by a well known magnetization using the Kerr Effect. The M-H curve shows some drastic changes and most drastic change in the M-H curve is change at outer magnetic filed H1 changing Mb1 to Mb2 like step.

SUMMARY OF THE INVENTION

It is an object of the present invention to obtain a magnetic core of smooth magnetic variation and provide a magnetic sensor, magnetic recording and/or reproducing head, and magnetic recording medium of high density and low BHN.

In a first aspect, the present invention provides an exchange coupling film, comprising: a ferromagnetic layer, and an antiferromagnetic layer disposed on the ferromagnetic layer. The antiferromagnetic layer is exchange coupled with the ferromagnetic layer and the exchange coupling film have a plurality of local magnetic regions. Each of the local regions has uniaxial magnetic anisotropy, and the uniaxial magnetic anisotropy of abutting local regions may be different from each other. The total magnetic anisotropy of the exchange coupling film is dispersed.

Each of the local regions of the ferromagnetic layer of the present invention is a small magnetic domain or magnetic region which receives unidirectional anisotropy magnetic fields from corresponding part of the antiferromagnetic layer which the ferromagnetic layer is exchange coupled with, and each of the small local regions has a magnetization fixed by the exchange coupling force. Therefore the irreversible magnetic transfer from the large domain walls surrounding the plurality of the small local regions in the ferromagnetic layer becomes suppressed and the magnetization characteristics become smooth enough that the magnetic anisotropy of the whole ferromagnetic layer becomes isotropic and the ferromagnetic layer has low BHN.

The local magnetic anisotropy may be introduced into the laminate film having the ferromagnetic layer and the antiferromagnetic layer by annealing or by depositing films in time-varying magnetic fields during some or each of the processing steps. A rotating magnetic field is one example of a time-varying magnetic field. These process steps are preferable for forming a magnetic circuit of isotropic permeability, such as a magnetic head.

(Delta Mb)/(delta M) in every directions of the exchange coupling film of the first aspect may be 10% or less which is much less than that of the conventional magnetic yoke, which is around 30%. Where delta Mb is most drastic magnetization change and equal to difference between the Mb1 and Mb2. Delta M is the magnetization range of the exchange coupling film from negative saturation magnetization (minus M) to positive saturation magnetization (plus M), when external magnetic fields (H) are applied to the exchange coupling film. The M-H curve may be measured by a well known method using the Kerr Effect.

The local regions of the first aspect of the present invention have a small plane area of 10% or less compared to whole plane area of the ferromagnetic layer. A one-sided length of the local regions of the aspect of the present invention may preferably be 5 micrometer or less.

The magnetic permeability of the whole ferromagnetic layer of the first aspect of the present invention also be isotropic enough and it is preferable to form a closed magnetic circuit. When the exchange coupling film has a disc-like external shape, change in permeability measured by applying magnetic fields at plural directions to the exchange coupling film of the first aspect of the present invention may be in the range from minus 10% to plus 10%.

In the above described (delta Mb)/(delta M) characteristic, size of the local regions, and the permeability measurement characteristic of the first aspect of the present invention may also be applied to the following second to fourth aspects of the present invention.

The ferromagnetic layer of the first aspect of the present invention may comprise soft ferromagnetic materials, such as NiFe, FeAlSi, an amorphous Co alloy such as CoZrNb, a fine grain soft ferromagnetic materials such as FeZrN, a granular soft ferromagnetic materials such as CoFeAlO, and a soft ferrite material such as MnZn ferrite. Ferromagnetic materials such as FeZrN or CoFeAlO are preferable to obtain high saturation magnetic flux density. The antiferromagnetic layer may comprise IrMn, PdMn, FeMn, NiMn, NiO, and amorphous Fe2O3.

A ferromagnetic materials such as NiFe or CoZrNb and an antiferromagnetic material chosen from IrMn, PtMn, and NiMn are preferably matched to achieve high exchange coupling force. A granular soft ferromagnetic materials such as CoFeAlO or a soft ferrite such as MnZn ferrite and an antiferromagnetic material such as NiO or amorphous Fe2O3 are preferable to obtain good RF characteristics.

The above described ferromagnetic materials, antiferromagnetic materials, and combination thereof are also preferable in the second to fourth aspects of the present invention.

In a second aspect, the present invention provides a magnetic sensor, comprising an exchange magnetic film having a magnetic core and a magnetoresistance element. The magnetic core has a ferromagnetic layer, and an antiferromagnetic layer. The antiferromagnetic layer is disposed on the ferromagnetic layer and exchange coupled with the ferromagnetic layer. The exchange coupling film has a plurality of local magnetic regions, and each of the local regions has uniaxial magnetic anisotropy. The uniaxial magnetic anisotropy of abutting local regions may be different from each other, and total magnetic anisotropy of the exchange coupling film may be dispersed. The magnetoresistance element is magnetically coupled to the magnetic core and preferably has a magnetoresistance film and a pair of electrodes electrically coupled to the magnetoresistance film.

A magnetic sensor according to the present invention has the exchange coupling film of low BHN as a result of suppressing large magnetic domain wall movement which produces magnetization transfer through the exchange coupling film. Therefore the magnetic sensor has a high signal/noise ratio and is suitable for high lengthwise track density.

The AMR element, and the GMR element may be used as the magnetoresistance element of the second aspect of the present invention. An advanced GMR element such as a Tunnel MagnetoResistance element (TMR element) which shows a higher MR amplitude than any conventional element has been reported and may be used as the magnetoresistance element of the second aspect of the present invention.

The magnetic sensor may be used as a magnetic reproducing head of an HDD which includes a magnetic recording medium (magnetic recording disk), an actuator, and the magnetic head for reproducing a signal recorded on the magnetic recording medium.

In a third aspect, the present invention provides a magnetic recording head, comprising a magnetic core having a ferromagnetic layer, and an antiferromagnetic layer, and a coil. The antiferromagnetic layer is disposed on the ferromagnetic layer, and the antiferromagnetic layer is exchange coupled with the ferromagnetic layer. The exchange coupling film has a plurality of local magnetic regions, and each of the local regions has uniaxial magnetic anisotropy. The uniaxial magnetic anisotropy of abutting local regions may be different from each other, and the total magnetic anisotropy of the exchange coupling film may be dispersed. The coil provides magnetic fields to the exchange coupling film, and the magnetic core transfers the magnetic fields to the core tip portion of the ABS.

A magnetic recording head according to the present invention has the exchange coupling film as a magnetic core which receives magnetic fields from the coil and transfers them to its tip portion for providing the signal to the magnetic recording medium. The magnetization direction of the exchange coupling film may be restricted by the exchange coupling force between the ferromagnetic layer and the antiferromagnetic layer and the discontinuous transfer from magnetic domain wall movement is suppressed enough that BHN is reduced.

The exchange coupling film when used as a magnetic yoke of the magnetic head according to the present invention may have a multilayer structure having a plurality of ferromagnetic layers to suppress reflux closure domain formation at the unstable tip portion of the magnetic yoke having a plane surface as large as several square micrometers~several 100 square micrometers. The reflux magnetic closure domain wall transfer should be the origin of BHN. Flux flows between each tip portion of the plurality of ferromagnetic layers which suppress formation of the magnetic reflux closure domain.

Providing a hard magnetic layer abutting the magnetic yoke may be another way to suppress the magnetic reflux closure domain formation.

In a fourth aspect, the present invention provides a magnetic recording medium, comprising a magnetic recording layer recording a magnetic signal in a film plane, and a exchange coupling film disposed on lower surface of the magnetic recording layer. The exchange coupling film has a ferromagnetic layer, and an antiferromagnetic layer. The antiferromagnetic layer is disposed on the ferromagnetic layer and exchange coupled with the ferromagnetic layer. The exchange coupling film has a plurality of local magnetic regions, and each of the local regions has uniaxial magnetic anisotropy. The uniaxial magnetic anisotropy of abutting local regions may be different from each other, and the total magnetic anisotropy of the exchange coupling film may be dispersed.

A magnetic recording medium according to the present invention having the exchange coupling film disposed on lower surface of the recording layer of the magnetic recording medium may be preferable because the exchange coupling film effectively converges signal magnetic fields provided from the magnetic recording head.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein.

DETAILED DESCRIPTION OF THE PREFERRED EMBODIMENTS

In various aspects, the present invention relates to an exchange coupling film and a magnetic sensor which takes advantage of magnetic anisotropy dispersion by controlling local magnetic anisotropy of the exchange coupling film.

First Embodiment

Figure 4:
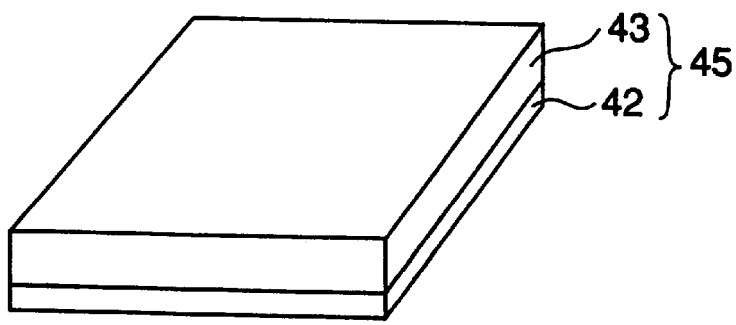
FIG. 4 is a bird's-eye view showing an exchange coupling film according to first embodiment of the present invention.

FIG. 4 is a bird's-eye view of an exchange coupling film according to the first embodiment of the present invention. The exchange coupling film 45 comprises an antiferromagnetic layer 42 and a ferromagnetic layer 43 disposed on and exchange coupled with the antiferromagnetic layer 42. The exchange coupled film 45 has local magnetic regions 43a. Magnetization of each of the magnetic region 43a is pinned by corresponding antiferromagnetic local region 42a by exchange coupling force and the magnetic domain wall 46 transfers is suppressed. The abutting local regions have different magnetic anisotropy shown as arrows in FIG. 5, and the total magnetic anisotropy of the exchange coupling film 45 is dispersed at 0 applied magnetic filed and it shows isotropic properties resulted from wide-angle dispersion of the anisotropy. The total magnetic anisotropy of the exchange coupling film may disappear as a result of the magnetic anisotropy dispersion. The exchange coupling film may be used in an inductor, D/D converter, power source, or noise filter.

The antiferromagnetic layer may comprise a material selected from well known antiferromagnetic materials such as IrMn, FeMn, PtMn, PdMn, PtPdMn, and NiO. The antiferromagnetic layer needs to be thick enough to give magnetic anisotropy to the ferromagnetic layer. The preferable range of the thickness is from about 1 nano-meter to 500 nano-meter.

The ferromagnetic layer may comprise a material selected from well known ferromagnetic materials such as Ni, Co, Fe, NiFe, CoNi, CoFe, and NiFeCo. Anisotropic magnetic fields of the ferromagnetic layer may be increased when the film thickness decreases. The film thickness of the ferromagnetic layer is preferably in the range from 10 nano-meter to 500 nano-meter to obtain substantial suppression of BHN and magnetic permeability of the ferromagnetic layer.

Figure 5:
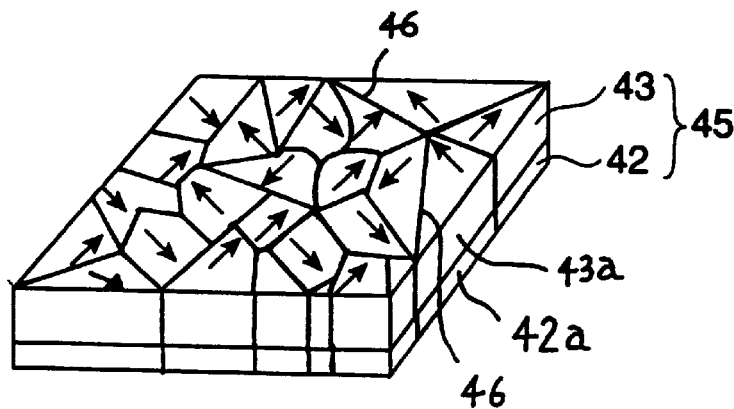
FIG. 5 is a schematic bird's-eye view showing pillar shape local regions each having magnetization different from adjacent regions, according to the first embodiment of the present invention.

Each of the magnetic local regions 43a may correspond to a magnetic domain when abutting magnetic local regions are separated by a magnetic domain wall. The domain size may preferably be smaller than 10% of the exchange coupling film. An average domain size of the exchange coupling film 200 micrometer×200 micrometer in area shown in FIG. 5 is about 5 micrometer×5 micrometer. The local regions are in ferromagnetic film and may have pillar shape and its top surface shape may be square, rectangular shape, distorted square, distorted rectangular, or circle.

Figure 6:
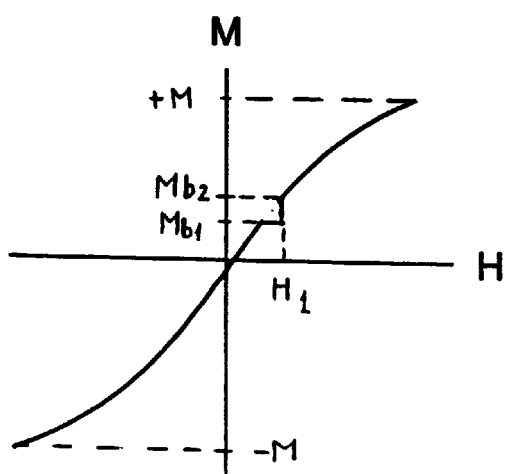
FIG. 6 is a graph illustrating experimental data showing the relationship between applied magnetic fields (H) and magnetization (M) of the exchange coupling film according to the first embodiment of the present invention.

A magnetization curve M-H of the exchange coupling film of the first embodiment is so smooth without discontinuous magnetization change as shown in FIG. 6. The discontinuous change is most drastic change (delta Mb) of magnetization shown as step between Mb1 and Mb2 of FIG. 3. (Delta Mb)/(delta M) of the present invention is 7%, where delta Mb is most drastic magnetization change and equal to difference between the Mb1 and Mb2. Delta M is the magnetization range of the exchange coupling film from negative saturation magnetization (minus M) to positive saturation magnetization (plus M), when external magnetic fields (H) are applied to the exchange coupling film. The M-H curve is measured by method using the Kerr Effect.

Second Embodiment

Figure 7:
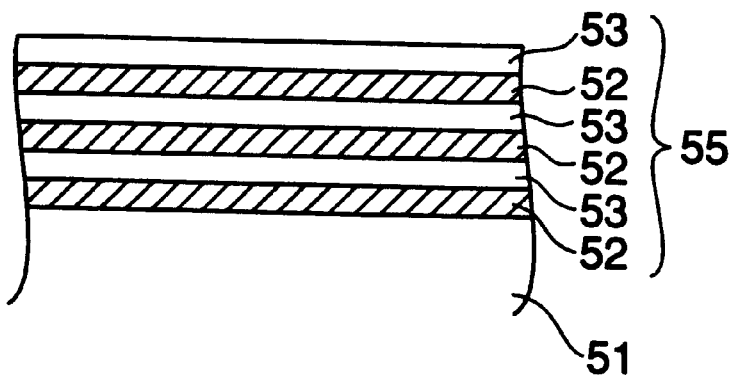
FIGS. 7 and 8 are cross-sectional views showing an exchange coupling film having a plurality pairs of antiferromagnetic and ferromagnetic layers according to second embodiment of the present invention.
Figure 8:
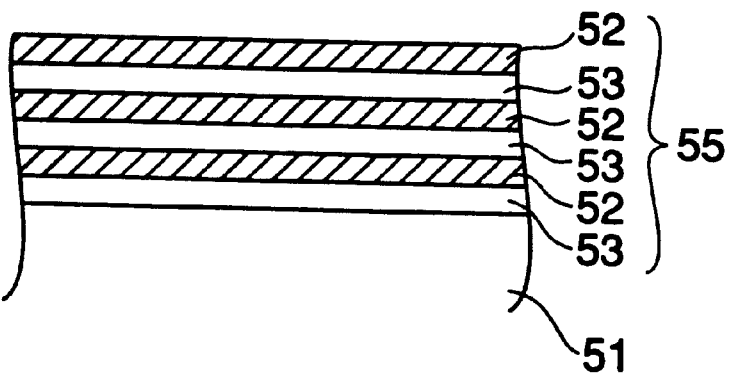

FIGS. 7 and 8 show cross-sectional views of exchange coupling films according to a second embodiment of the present invention. The exchange coupling film 55 has a multilayer structure and comprises a plurality of antiferromagnetic layers 52 and a plurality of ferromagnetic layers 53 each laminated alternately, as shown in FIG. 7. The exchange coupling film 55 is disposed on a substrate 51. The strength of the anisotropic magnetic fields which the ferromagnetic receives are in inverse proportion to the film thickness of the ferromagnetic layer 53. The multilayer structure enables increasing both the anisotropic magnetic fields which each of the ferromagnetic layer 53 receives and the film thickness of exchange coupling film 55.

Figure 9:
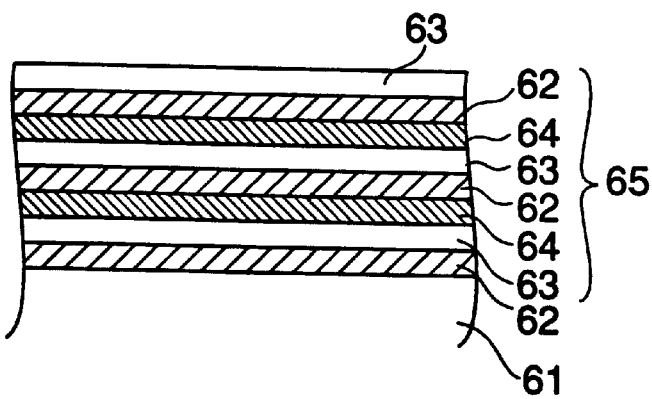
FIGS. 9 and 10 are cross-sectional views showing modified exchange coupling films according to the second embodiment of the present invention.
Figure 10:
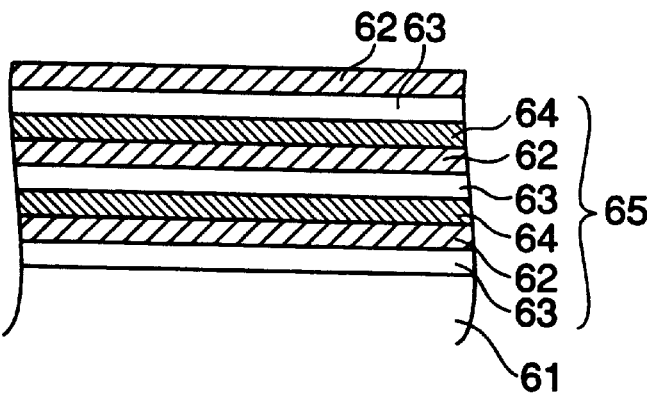

FIGS. 9 and 10 are cross-sectional views of modified exchange coupling films according to the second embodiment of the present invention. Each of the exchange coupling films is formed on substrate 61 and comprises a multilayer structure having a plurality of ferromagnetic layers 63, a plurality of antiferromagnetic layers 62, and a plurality of nonmagnetic layers 64. Each of the nonmagnetic layers 64 separates the ferromagnetic layers 63 and the antiferromagnetic layers 62 so that each of the ferromagnetic layers 63 contacts an adjacent antiferromagnetic layer 62 on only one of its sides.

Third Embodiment

Figure 11:
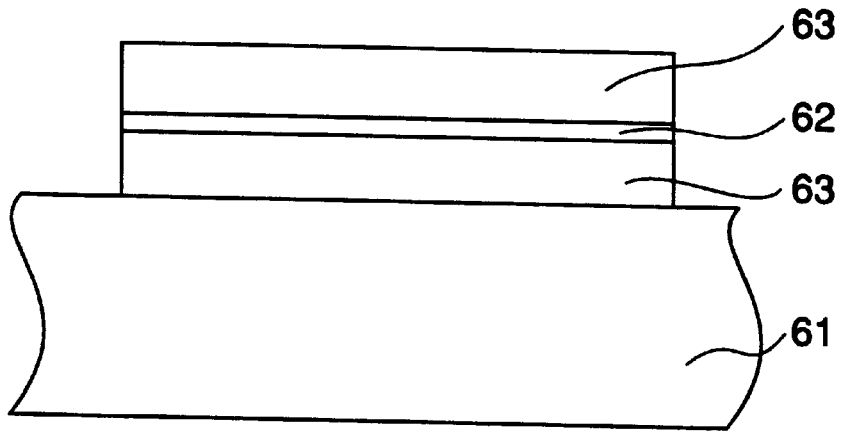
FIG. 11 is a cross-sectional view showing a three-layered exchange coupling film according to third embodiment of the present invention.

FIG. 11 shows a cross-sectional view of an exchange coupling film according to a third embodiment of the present invention. This embodiment preferably uses ferromagnetic and antiferromagnetic films having properties described above in the first embodiment. A thin antiferromagnetic layer 62 of, for example, 5 nano-meter thickness, is sandwiched by ferromagnetic layers 63 of soft ferromagnetic material formed on a substrate 61. Layers 63 are preferably approximately 100 nano-meter thick. NiFe is preferably used as the ferromagnetic material and IrMn is preferably used as the antiferromagnetic material. The layers are deposited in rotating magnetic fields of 60 revolutions/min and 300 Oe, and the substrate 61 is annealed at 200 C. An external shape of the exchange coupling film is approximately round with a 5 mm diameter.

Figure 1:
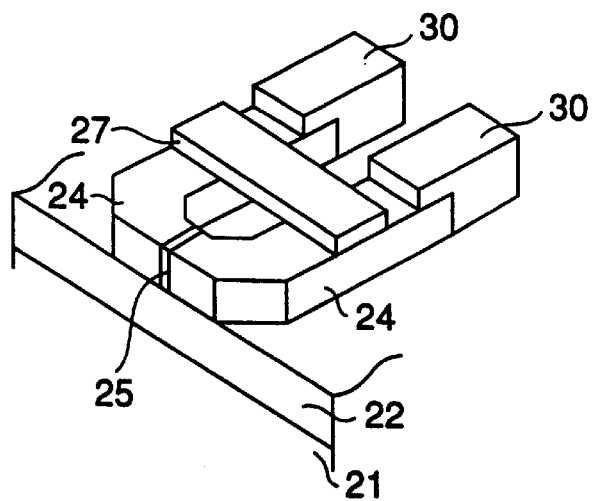
FIG. 1 is a bird's-eye view of showing a magnetic head of plane yoke structure according to the prior art.
Figure 2:
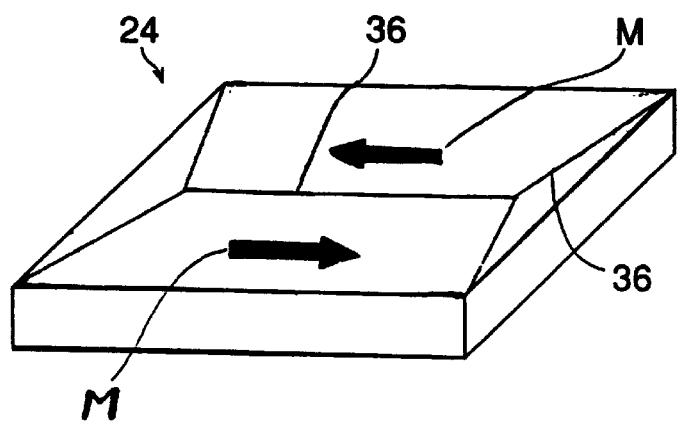
FIG. 2 is a schematic bird's-eye-view of magnetic domains of an exchange coupling film of the prior art.
Figure 3:
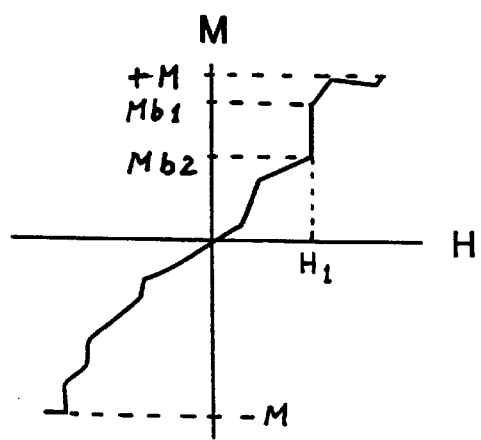
FIG. 3 is a graph illustrating experimental data showing relation between applied magnetic fields (H) and magnetization (M) of the exchange coupling film of the prior art.

The relationship between magnetization (M) and magnetic fields (H) ranging from minus 40 Oe to plus 40 Oe was measured at several directions of 0, 15, 30, 45, 60, 75, 90 degrees from a randomly chosen direction on the surface of the exchange coupling film. (Delta Mb)/(delta M) for every direction was 10% or less, where delta M is the most drastic magnetization change which appears as noise and is equal to the difference between the Mb1 and Mb2 (see FIG. 6). For comparison, the (delta Mb)/(delta M) of the conventional exchange coupling film shown in FIG. 3 is about several 30%. The relationship between the magnetic flux density (B) and the magnetic field (H) was also measured, and the magnetic permeability of all of these directions were in the range from minus 10% to plus 10%.

Fourth Embodiment

Figure 12:
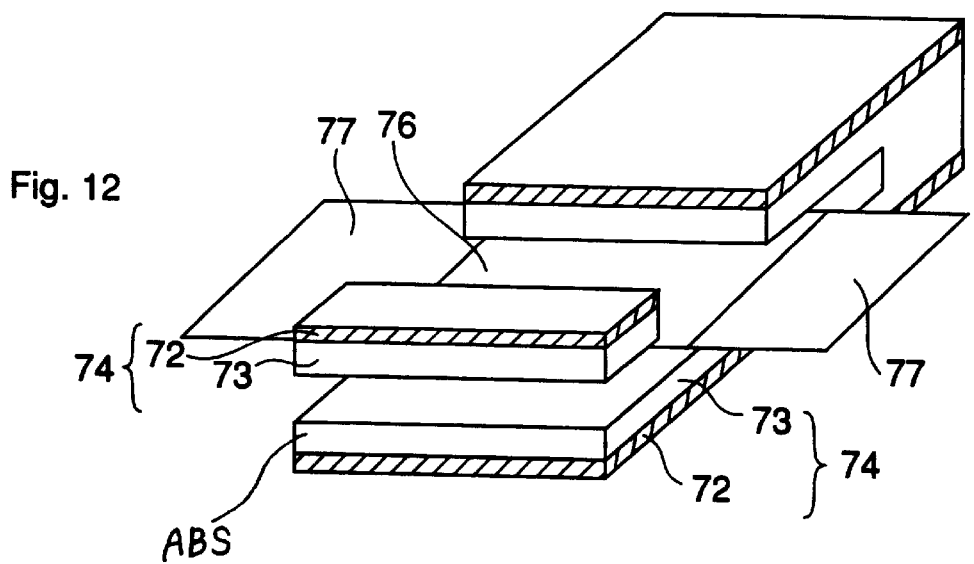
FIG. 12 is a bird's eye view showing a magnetic sensor according to a fourth embodiment of the present invention.

FIG. 12 shows a bird's-eye-view of a magnetic head according to a fourth embodiment of the present invention. The magnetic head is a reproducing head and comprises a magnetoresistance film for sensing signal magnetic fields. This embodiment preferably uses ferromagnetic and antiferromagnetic films having properties described above in the first embodiment.

Ferromagnetic layers 72 and antiferromagnetic layers 73 disposed on the ferromagnetic layers 72 are exchange coupling films and behave as yokes 74 of the magnetoresistance head. The yokes 74 extend from the ABS and to magnetoresistance film 76 which is located behind the ABS to provide the signal magnetic fields picked up at the ABS by the magnetoresistance film 76. The magnetic domain will transfer in the yokes of the exchange coupling film is suppressed enough and BHN is sufficiently suppressed. The magnetoresistance film 76 is coupled with a pair of electrodes 77 at both end terminals of the magnetoresistance film 76. Electrodes 77 provide an electric current to the magnetoresistance film 76. The resistance variation of the magnetoresistance film 76 is measured by a voltage sensor (not shown).

Fifth Embodiment

Figure 13:
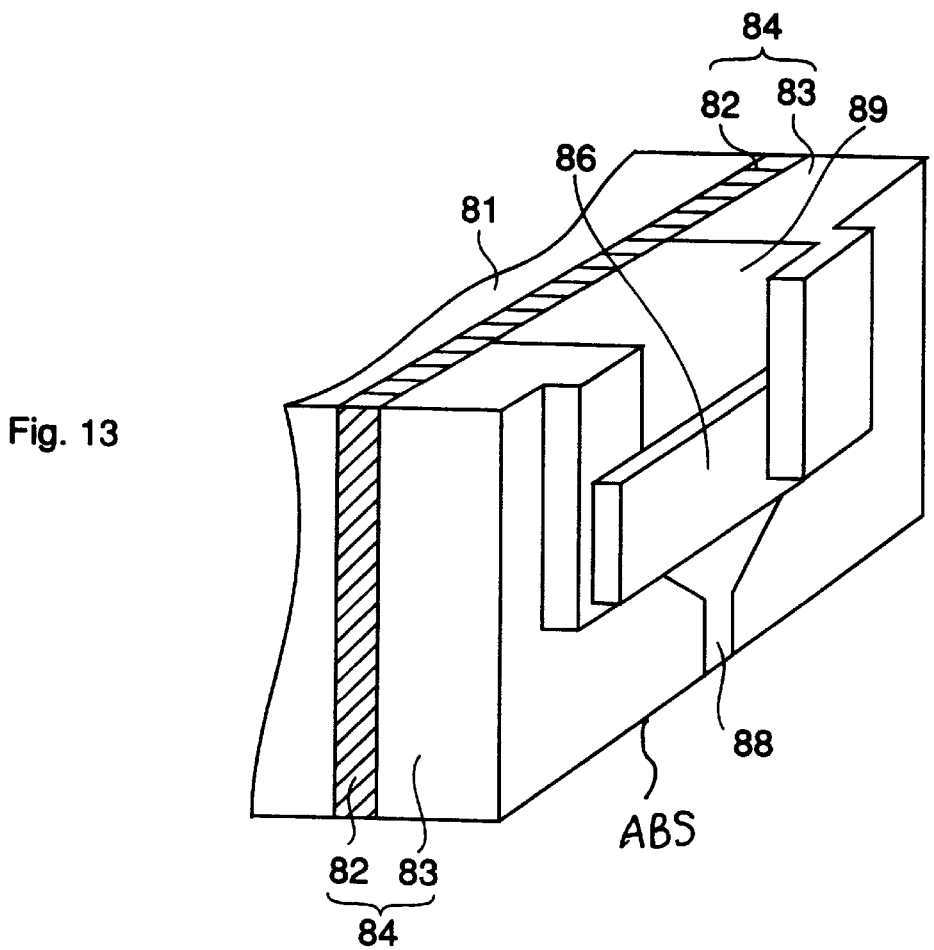
FIG. 13 is a bird's eye view showing a magnetic reproducing sensor according to a fifth embodiment of the present invention.

FIG. 13 shows a bird's-eye-view of a magnetic head according to a fifth embodiment of the present invention. The magnetic head of the fifth embodiment of the present invention is for reproducing signal magnetic fields and comprises a magnetoresistance film. This embodiment preferably uses ferromagnetic and antiferromagnetic films having properties described above in the first embodiment.

An antiferromagnetic layer 82 and a ferromagnetic layer 83 are provided on substrate 81. A ferromagnetic layer 83 is disposed on and exchange coupled with the antiferromagnetic layer 82 and the ferromagnetic layer 83 behaves as yoke of the magnetic head. The magnetic anisotropy dispersion of the ferromagnetic layer 83 is preferable for suppressing BHN. Signal magnetic fields picked up at the ABS are introduced to the magnetoresistance film 86 disposed behind the ABS. The head has a magnetic gap between the yokes 84 at the ABS. The back ends of the ferromagnetic layers 83 are separated by insulator layer 89 and the magnetoresistance film 86 is disposed on the plane surface of the insulator layer 89 and yokes 83. The magnetic gap 88 extends in the vertical direction to the substrate surface. A gap length of the head is between the yokes 84 and the gap width is the thickness of the yoke 83. Magnetic track width of the head is defined by film thickness of the ferromagnetic layer 83, therefore the track width of the magnetic head is free from limit of fine pattern lithography and is enough short to obtain high density. Also, the short track width can be obtained by controlling film thickness by deposition speed or deposition period of ferromagnetic layer 83 deposited above the substrate 81.

Sixth Embodiment

Figure 14:
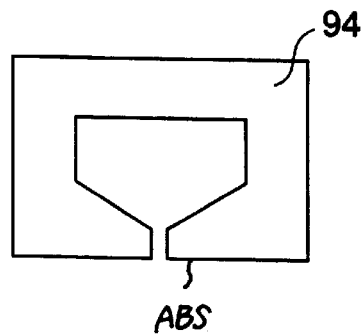
FIGS. 14 and 15 are plane views showing a magnetic core and a magnetic core with magnetic bias film, respectively, according to a sixth embodiment of the present invention.
Figure 15:
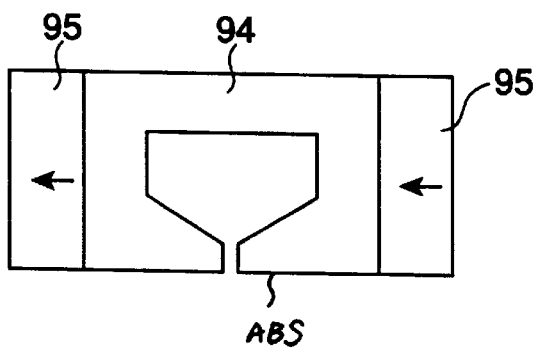

FIGS. 14 and 15 show plan views of exchange coupling films according to a sixth embodiment of the present invention. This embodiment preferably uses ferromagnetic and antiferromagnetic films having properties described above in the first embodiment. An antiferromagnetic layer and a ferromagnetic layer are laminated and exchange coupled with each other. A 20 nano-meter thick PtMn layer and a 300 nano-meter thick NiFe layer are deposited on a substrate and then annealed in rotating magnetic fields of 5 kOe at 300 C for 10 hours to produce local magnetic anisotropy. After the annealing, the exchange coupling films is patterned to have an external shape as shown in FIG. 14. Another exchange coupling film 94 is attached with hard magnetic layers 95 as shown in FIG. 15. Each of the hard magnetic layers 95 is a 300 nano-meter thick CoPt layer and is provided with a magnetization direction shown by the arrows in FIG. 15. Each of the hard magnetic layers 95 are formed on a 20 nano-meter Ti layer. Magnetic reflux closure domain was measured in the exchange coupling film shown in FIG. 14, using the Kerr effect. On the other hand, magnetic reflux closure domain was not measured in the exchange coupling film attached with the hard magnetic layers 95. The magnetic reflux closure domain disturbs high magnetic permeability and low BHN of the exchange coupling film. The exchange coupling film according to the sixth embodiment provides high magnetic permeability and low BHN.

Seventh Embodiment

Figure 16:
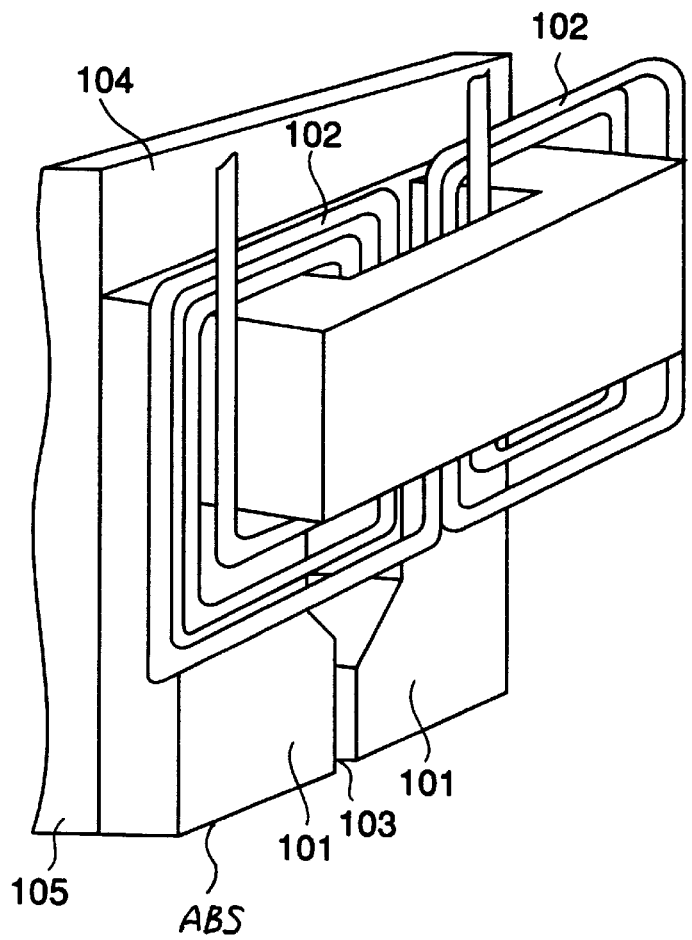
FIG. 16 is bird's-eye view showing a magnetic recording head according to a seventh embodiment of the present invention.

FIG. 16 shows bird's-eye-view of a magnetic head having a coil according to seventh embodiment of the present invention. The magnetic head has magnetic yoke 101, coil 102, and magnetic gap 103 formed at ABS. The magnetic yoke 101 has one of the exchange coupling films described in preceding first through third embodiments. The coil 102 winds about the magnetic yoke 101 and provides signal magnetic fields to the yoke 101. Yoke 101 transfers the magnetic fields to the pole tips of the yoke 101 at the ABS to write a signal magnetic field to a magnetic recording medium facing the ABS (not shown). The magnetic gap 103 is formed at the ABS and is between each pole tips of the yoke 101. The yoke 101 is provided on a main surface 104 of substrate 105 and has a main surface parallel to the main surface 104 of the substrate 105. The gap 103 extends vertically to the main surface of the yoke 101. The gap length is the distance between the two pole tips of the yoke 101 and the gap width is the height extending vertically to the main surface of the yoke 101.

Eighth Embodiment

Figure 17:
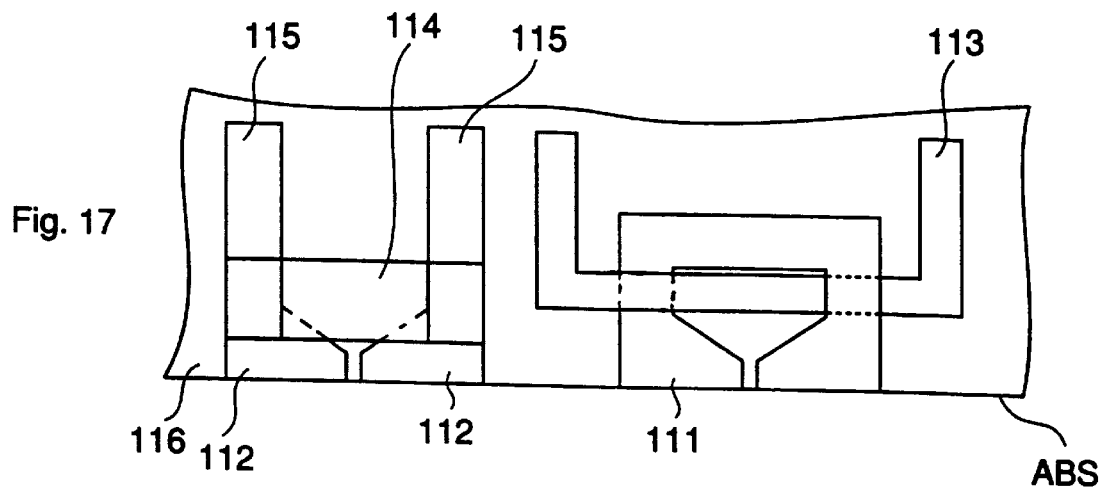
FIG. 17 is plane view showing a composite magnetic head according to an eighth embodiment of the present invention.

FIG. 17 shows plane view of composite magnetic head according to an eighth embodiment of the present invention magnetic yokes 111 and 112 comprise one of the exchange coupling films of the above described first through third embodiments. The composite magnetic head has a magnetic recording head and a magnetic reproducing head. The magnetic recording head has magnetic yoke 111 and coil 113 which provides signal magnetic fields to the yoke 111. The yoke 111 receives the signal magnetic fields from the coil 113 and transfers them to the ABS. The magnetic reproducing head has magnetic yokes 112, a magnetoresistance film 114, and a pair of electrodes 115 coupled to the magnetoresistance film 114. The magnetic yokes 112 pick up signal magnetic fields at the ABS and transfer them to the magnetoresistance film 114. A resistance change in the magnetoresistance film 114 is produced by a change in magnetization direction of the magnetic recording film and may be sensed by galvanometer or voltmeter coupled to the electrodes 115 (not shown). The yokes 111 and 112 are disposed on a main surface 116 of a substrate by the same manner as described in the fifth through seventh embodiments.

The magnetic yoke 111 preferable comprises a 100 nano-meter NiFe layer, a 5 nano-meter IrMn layer, and a 100 nano-meter NiFe layer, where all of the layers are formed in sequence on the main surface 116 of the substrate. The layers are deposited in a rotating magnetic fields of 60 revolutions/min of 300 Oe. During the deposition, the substrate is heated at 200 C. The layers are patterned to form magnetic yokes 112 shown in FIG. 17. On the patterned magnetic yoke 112, the magnetoresistance film 114 preferably comprising a CoFe layer, a Cu layer, a CoFe layer, and an IrMn layer is formed. After the deposition of electrodes 115, a 100 nano-meter FeCo layer, a 5 nano-meter IrMn layer, and a 100 nano-meter FeCo layer are preferably deposited on the main surface 116 of the yokes 112, as shown in FIG. 17 by the same manner as used for magnetic yoke 111. Each of the magnetic heads has a magnetic gap at the ABS and a gap with (magnetic track width) of approximately 200 nano-meter, the same as the thickness (height) of the yokes 111, 112. The magnetic gap length is the length between each pair of the pole tip portions of the magnetic yokes 111, 112.

Ninth Embodiment

Figure 18:
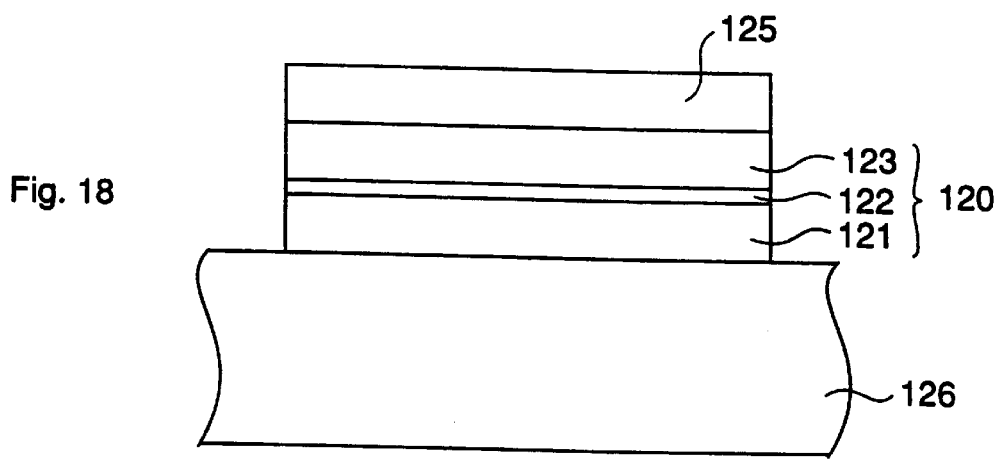
FIG. 18 is a cross-sectional view showing a magnetic recording medium according to a ninth embodiment of the present invention.

FIG. 18 shows cross-sectional view of a magnetic recording medium according to a ninth embodiment of the present invention. The magnetic recording medium comprises an exchange coupling film 120 and a recording layer 125 formed on the exchange coupling film 120, as shown in FIG. 18. The exchange coupling film preferably has a 100 nano-meter NiFe layer 121, a 5 nano-meter IrMn layer 122, and a 100 nano-meter NiFe layer 123 formed on main surface of a substrate 126, as shown in FIG. 18. The exchange coupling film is formed by depositing the layers in rotating magnetic fields of 60 revolutions/min of 300 Oe with heating the substrate at 200 C. A 100 nano-meter CoCr layer is preferably formed as the recording layer 125. The recording medium of the ninth embodiment is preferable for high density recording and for vertical recording, because the magnetic domain size of the exchange coupling film is very small.

Tenth Embodiment

Figure 19:
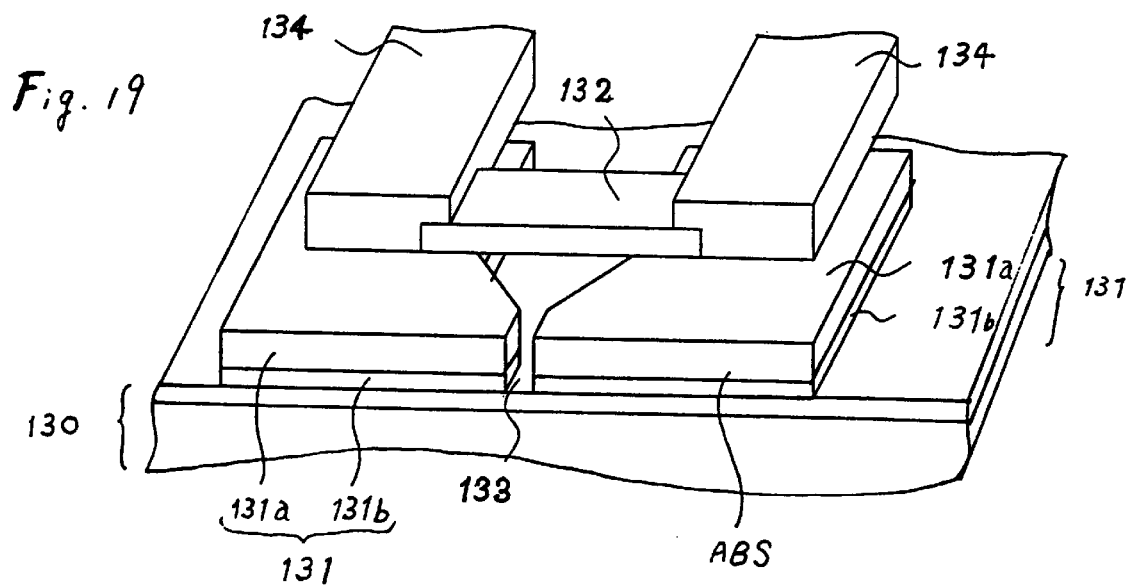
FIG. 19 is a bird's eye view showing a magnetic reproducing sensor according to a tenth embodiment of the present invention.

FIG. 19 shows bird's-eye view of a magnetic reproducing sensor according to a tenth embodiment of the present invention. The magnetic yokes 131 are formed on Al2O3TiC substrate 130 and have major plane surface parallel to main surface of the Al2O3/TiC substrate 130. The major plane surfaces of the pair of magnetic yokes 131 form single plane and comprising having magnetic gap 133 between pair of tip portions of the magnetic yokes 131 at ABS. The magnetic gap may be formed by nonmagnetic material such as SiO2 or Al2O3. The magnetoresistance film 132 is disposed on the magnetic yokes 131 so as to be magnetically coupled with each of the magnetic yokes 131 at rear portion behind the ABS. Each of end portions of the magnetoresistance effect film 132 is coupled with corresponding one of electrodes 134. The electrodes 134 provides sense current to the magnetoresistance effect element 132. Each of the magnetic yokes 131 comprises ferromagnetic layer 131*a* and antiferromagnetic layer 131*b* and the plurality of local regions (not shown) formed in the ferromagnetic layers 131*a* by exchange coupling force, therefore the magnetic transfer in the ferromagnetic layers 131*a* are smooth and S/N rate of BHN is very high.

What is claimed as new and desired to be protected by Letters Patent is:

1. An exchange coupling film, comprising:
a ferromagnetic layer, and an antiferromagnetic layer disposed on the ferromagnetic layer, the antiferromagnetic layer being exchange coupled with the ferromagnetic layer, the exchange coupling film having a plurality of local magnetic regions, each of the local regions having uniaxial magnetic anisotropy so that total anisotropy of the exchange coupling film being dispersed.

2. An exchange coupling film according to claim 1, wherein said local regions each have a top plane area of no more than about 10% of substantially an entire top plane area of the exchange coupling film so that the total magnetic anisotropy of the exchange coupling film being dispersed.

3. An exchange coupling film according to claim 1, wherein a one-sided length of one of said local regions is not more than about 5 micrometer.

4. An exchange coupling film according to claim 1, wherein a whole magnitude permeability of said ferromagnetic layer is in the range from minus 10% to plus 10%.

5. An exchange coupling film according to claim 1, wherein most drastic magnetization change shown as (delta Mb)/(delta M) of the ferromagnetic film is not more than 10%, where delta Mb is most drastic value change while outer magnetic field ranging from negative saturation magnetic field (minus H) to positive saturation magnetic field (plus H) is applied, and delta M is magnetization range of the ferromagnetic layer from negative magnetization (minus M) to positive saturation magnetization (plus M), when outer magnetic fields applied.

6. An exchange coupling film according to claim 1, wherein said ferromagnetic layer comprises one of a soft ferromagnetic material, an amorphous Co alloy, a fine grain soft ferromagnetic material, a granular soft ferromagnetic material, and a soft ferrite material.

7. An exchange coupling film according to claim 1, wherein said antiferromagnetic layer comprises one of IrMn, PdMn, PtMn, NiMn, NiO, FeMn, and amorphous Fe2O3.

8. An exchange coupling film according to claim 1, wherein:
    said ferromagnetic layer comprises one of NiFe and CoZrNb; and said antiferromagnetic layer comprises one of IrMn, PtMn, and NiMn.

9. An exchange coupling film according to claim 1, wherein:
    said ferromagnetic layer comprises one of a granular soft ferromagnetic material and a soft ferrite; and said antiferromagnetic layer comprises one of NiO and amorphous Fe2O3.

10. An exchange coupling film according to claim 1, comprising:
    the exchange coupling film having a plurality of local magnetic regions pinned to corresponding local regions in the antiferromagnetic layer, each of the pinned local magnetic regions having uniaxial magnetic anisotropy so that total magnetic anisotropy is dispersed.

11. An exchange coupling film according to claim 1, further comprising:
    a second ferromagnetic layer;
    said antiferromagnetic layer being disposed between said ferromagnetic layers.

12. An exchange coupling film according to claim 1, comprising a plurality of said ferromagnetic layer and a plurality of said antiferromagnetic layer being alternately arranged.

13. An exchange coupling film according to claim 12, wherein each pair of said alternately arranged ferromagnetic and antiferromagnetic layers is separated by a nonmagnetic layer.

14. An exchanger coupling film according to claim 1, comprising:
    a bias field providing film disposed adjacent to said exchange coupling film;
    an end portion of said exchange coupling film being in contact with the bias field providing film.

15. A magnetic sensor, comprising:
    a magnetic core having a ferromagnetic layer and an antiferromagnetic layer, the antiferromagnetic layer being disposed on the ferromagnetic layer and being exchange coupled with the ferromagnetic layer, the core having a plurality of local magnetic regions, each of the local regions having uniaxial magnetic anisotropy; and
    a magnetoresistance element magnetically coupled to the magnetic core and having a magnetoresistance film and a pair of electrodes, the pair of electrodes being electrically coupled to the magnetoresistance film;
    said uniaxial magnetic anisotropy of abutting local regions being different from each other, and a total magnetic anisotropy of the core being dispersed.

16. A magnetic sensor according to claim 15, wherein the magnetoresistance element comprises one of a giant magnetoresistance element and a tunnel magnetoresistance element.

17. A magnetic sensor according to claim 15, comprising:
    said core having a magnetic yoke, said yoke having a plurality of said local magnetic regions, each of said local regions in said yoke having uniaxial magnetic anisotropy, said uniaxial magnetic anisotropy of abutting local regions in said yoke being different from each other, and a total magnetic anisotropy of said yoke being dispersed.

18. A magnetic head, comprising
    a magnetic core having a ferromagnetic layer, and an antiferromagnetic layer, the antiferromagnetic layer being disposed on the ferromagnetic layer, the antiferromagnetic layer being exchange coupled with the ferromagnetic layer, the core having a plurality of local magnetic regions, each of local regions having uniaxial magnetic anisotropy; and
    a coil which provides magnetic fields to the core;
    wherein the magnetic cores transfers the magnetic fields to a core tip potion of an air bearing surface; and
    wherein the uniaxial magnetic anisotropy of abutting local regions is different from each other, and total magnetic anisotropy of the core is dispersed.

19. A magnetic head according to claim 18, wherein:
    the magnetic core has a major surface substantially forming a single plane and comprising a first magnetic core and a second magnetic core;
    the first and the second magnetic cores being separated by a gap at a recording medium facing surface.

20. A magnetioc head according to claim 18, further comprising a magnetic reproducing head, the magnetic reproducing head comprising:
    a second magnetic core, the second magnetic core having a ferromagnetic layer and an antiferromagnetic layer, the antiferromagnetic layer being disposed on the ferromagnetic layer and being exchanged coupled with the ferromagnetic layer, the second magnetic core having a plurality of local magnetic regions, each of the local regions having uniaxial magnetic anisotropy, the uniaxial magnetic anisotropy of abutting local regions being different from each other, and total magnetic anisotropy of the second magnetic core being dispersed, and
    a magnetoresistance element magnetically coupled to the second magnetic core and having a magnetoresistance film and a pair of electrodes, the electrodes being electrically coupled to the magnetoresistance film.

* * * * *